United States Patent
Ko et al.

(10) Patent No.: US 7,494,866 B2
(45) Date of Patent: Feb. 24, 2009

(54) SEMICONDUCTOR DEVICE AND RELATED METHOD OF MANUFACTURE

(75) Inventors: Hwa-Young Ko, Suwon-si (KR); Kyung-Rae Byun, Suwon-si (KR); Hyoung-Seub Rhie, Suwon-si (KR); Hee-Seok Kim, Seongnam-si (KR); Jin-Hwan Ham, Seoul (KR); Suk-Ho Joo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 181 days.

(21) Appl. No.: 11/403,901

(22) Filed: Apr. 14, 2006

(65) Prior Publication Data
US 2006/0237851 A1    Oct. 26, 2006

(30) Foreign Application Priority Data
Apr. 25, 2005    (KR) .................. 10-2005-0033872

(51) Int. Cl.
*H01L 21/8242* (2006.01)
(52) U.S. Cl. ............... 438/253; 438/3; 438/239; 257/295; 257/296
(58) Field of Classification Search ............ 438/3, 438/195, 197, 239, 253; 257/295, E21.663, 257/E21.664, E27.104, E29.164
See application file for complete search history.

(56) References Cited

U.S. PATENT DOCUMENTS

| | | | |
|---|---|---|---|
| 6,171,970 B1 * | 1/2001 | Xing et al. | 438/706 |
| 6,366,489 B1 | 4/2002 | Salling | |
| 6,426,255 B1 * | 7/2002 | Asano et al. | 438/253 |
| 6,544,834 B1 * | 4/2003 | Sugawara et al. | 438/240 |
| 6,576,509 B1 * | 6/2003 | Toyokawa et al. | 438/253 |
| 6,649,955 B2 * | 11/2003 | Lee | 257/295 |
| 2005/0037569 A1 * | 2/2005 | Itoh | 438/253 |
| 2005/0148139 A1 * | 7/2005 | Sashida | 438/239 |

FOREIGN PATENT DOCUMENTS

| | | |
|---|---|---|
| JP | 2003-243621 | 8/2003 |
| KR | 1997-0077662 | 12/1997 |
| KR | 10-0295568 | 4/2001 |
| KR | 1020030053668 | 7/2003 |

* cited by examiner

*Primary Examiner*—Ha Tran T Nguyen
*Assistant Examiner*—Daniel Whalen
(74) *Attorney, Agent, or Firm*—Volentine & Whitt, PLLC

(57) ABSTRACT

Disclosed are a semiconductor device and a related method of manufacture. The semiconductor device comprises a semiconductor substrate, a conductive structure including contact regions and gate structures formed on the semiconductor substrate, a protection layer formed on the gate structures, an insulation layer formed on the protection layer, and a plurality of contacts directly contacting the contact regions and the semiconductor substrate through the insulation layer, wherein the contacts have substantially different heights from each other.

23 Claims, 13 Drawing Sheets

SEMICONDUCTOR DEVICE AND RELATED METHOD OF MANUFACTURE

BACKGROUND OF THE INVENTION

1. Field of the Invention

Example embodiments of the present invention relate generally to semiconductor devices and related methods of manufacture. More particularly, example embodiments of the present invention relate to a semiconductor device having a simplified structure adapted to improve its electrical characteristics, and a related method of manufacture.

A claim of priority is made to Korean Patent Application No. 2005-33872, filed on Apr. 25, 2005, the disclosure of which is hereby incorporated by reference in its entirety.

2. Description of the Related Art

Volatile semiconductor memory devices such as dynamic random access memory (DRAM) and static random access memory (SRAM) lose stored data when their power is turned off, whereas nonvolatile semiconductor memory devices such as erasable programmable read only memory (EPROM), electrically erasable programmable read only memory (EEPROM), or a flash memory can maintain stored data even when their power is turned off. Because volatile semiconductor memory devices lose data when they lose power, they are not very attractive for certain applications such as long term storage in portable devices. On the other hand, nonvolatile semiconductor memory devices also have limitations such as their relatively low degree of integration, relatively slow response time, and high operating voltage. To address at least some of the limitations of nonvolatile memory devices, ferroelectric random access memories (FRAMs) have been developed.

A FRAM is a nonvolatile memory device that stores data using double polarization of a ferroelectric material. Constructionally, a FRAM contains an array of ferroelectric capacitors, which use the ferroelectric material as a dielectric. The ferroelectric material forms a nonlinear dielectric having a dielectric polarization that forms a hysteresis loop based on variations of an electric field. FRAM devices tend to a have rapid operating speed, a low operating voltage, and high durability. As a result, FRAM devices are considered an attractive option for next generation memory systems. At present, ferroelectric materials such as $PZT[(Pb, Zr)TiO_3]$, SBT $(SrBi_2Ta_2O_9)$ and BLT $[(Bi, La)TiO3]$ have been developed for FRAM devices.

A FRAM device is disclosed, for example, in Korean Laid-Open Patent Publication No. 1997-77662, U.S. Pat. No. 6,366,489, and Japanese Laid-Open Patent Publication No. 2003-243621.

FIGS. 1 to 4 are cross-sectional views illustrating various methods of manufacturing a conventional ferroelectric memory device.

Referring to FIG. 1, an isolation layer 3 is formed in an upper portion of a semiconductor substrate 1 to divide semiconductor substrate 1 into a cell area "C", a first peripheral circuit area "P1" and a second peripheral circuit area "P2".

A gate oxide layer is formed on a portion of the semiconductor substrate 1 that is exposed through isolation layer 3, and then the gate oxide layer is partially etched to form first gate oxide layer patterns 6 in cell area C and a second gate oxide layer pattern 6' in first peripheral circuit area P1.

A first gate conductive layer pattern 9, a second gate conductive layer pattern 12, and a first gate mask pattern 15 are successively formed on first gate oxide layer patterns 6 in cell area C. At the same time, a third gate conductive layer pattern 9', a fourth gate conductive layer pattern 12' and a second gate mask pattern 15' are successively formed on second gate oxide layer pattern 6' in first peripheral circuit area P1. A fifth gate conductive layer pattern 9", a sixth gate conductive layer pattern 12" and a third gate mask pattern 15" are formed on isolation layer 3 in first peripheral circuit area P1 without a gate oxide layer pattern between isolation layer 3 and the fifth gate conductive layer pattern 9". As a result, first gate structures 21 are formed in the cell area C, and second and third gate structures 21' and 21" are formed in first peripheral circuit area P1.

Respective first, second and third gate spacers 18, 18' and 18" are formed on sidewalls of respective first, second and third gate structures 21, 21' and 21", and then source/drain regions 24 and 27 are formed in semiconductor substrate 1 in cell area C by an ion implantation process using first gate structures 21 in cell area C as a mask.

After a first conductive layer is formed on semiconductor substrate 1 to cover first gate structures 21 in cell area C, the first conductive layer is patterned to form pads 30 and 33 in contact with source/drain regions 24 and 27, respectively.

Referring to FIG. 2, a first insulating interlayer 36 is formed on an overall upper face of the semiconductor substrate 1 to cover cell area C, first peripheral circuit area P1 and second peripheral circuit area P2, and then a second insulating interlayer 39 is formed on first insulating interlayer 36.

Second insulating interlayer 39 and first insulating interlayer 36 are partially etched by a photolithography process to form a first contact hole 45 in cell area C, second, third, fourth, fifth and sixth contact holes 48, 51, 54, 57 and 60 in first peripheral circuit area P1, and a seventh contact hole 42 in second peripheral circuit area P2. First contact hole 45 in cell area C exposes pad 33; third contact hole 51 in the first peripheral circuit area P1 exposes fourth gate conductive layer pattern 12' of second gate structure 21'; and fifth contact hole 57 exposes sixth gate conductive layer pattern 12" of third gate structure 21". Second contact hole 48, fourth contact hole 54 and sixth contact hole 60 expose semiconductor substrate 1 in first peripheral circuit area P1. Seventh contact hole 42 exposes semiconductor substrate 1 in second peripheral circuit area P2. Here, openings for each forming a bit line are formed at an upper portion of first, second, fourth, fifth and seventh contact holes 42, 48, 54, 57 and 42.

Referring to FIG. 3, a second conductive layer is formed on second insulating interlayer 39 to fill first through seventh contact holes 45, 48, 51, 54, 57, 60 and 42, and then an upper portion of the second conductive layer is removed until second insulating interlayer 39 is exposed. As a result, a first bit line 66' and a first contact 69 are formed in first contact hole 45 of cell area C, and a second bit line 66" and a second contact 72 are formed in second contact hole 48 of first peripheral circuit area P1. A third contact 75 is formed in third contact hole 51 of first peripheral circuit area P1, and a third bit line 66''' and a fourth contact 78 are formed in fourth contact hole 54. A fourth bit line 66'''' and a fifth contact 81 are formed in fifth contact hole 57 of first peripheral circuit area P1, and a sixth contact 84 is formed in sixth contact hole 60. A fifth bit line 66 and a seventh contact 63 are formed in seventh contact hole 42 of second peripheral circuit area P2.

Referring to FIG. 4, a third insulating interlayer 87 is formed on first through fifth bit lines 66', 66", 66''', 66'''' and 66, third and sixth contacts 75 and 84 and second insulating interlayer 39.

Third insulating interlayer 87, second insulating interlayer 39 and first insulating interlayer 36 are successively etched to form eighth contact holes exposing pads 30, which make contact with source/drain regions 24. A third conductive layer is formed on third insulating interlayer 87 to fill up eighth contact holes, and then the third conductive layer formed on third insulating interlayer 87 is removed to form eighth contacts 90 in the eighth contact holes. Eighth contacts 90 make contact with pads 30, which are respectively positioned on source/drain regions 24.

In the method described with reference to FIGS. 1 through 4, the semiconductor substrate and the pads or gate structures may be damaged in an etching process used to form the contact holes through the insulating interlayers, because the contact holes have substantially different depths from one another. As illustrated in FIG. 2, where insulating interlayers 36 and 39 are etched to form contact holes 42, 45, 48, 51, 54, 57 and 60, which have substantially different depths from each other, a portion of semiconductor substrate 1 exposed in the peripheral circuit area, or gate structures 21' and 21" are damaged in the etching process. Furthermore, as illustrated in FIG. 4, where insulating interlayers 36, 39 and 87 are etched to form the contact holes, pads 30 on source/drain regions 24 positioned in cell area C are commonly damaged, thereby deteriorating the electrical characteristics of the semiconductor device.

After pads 30 and 33 are formed on source/drain regions 24 and 27, a number of processes are generally further performed, which complicates the structure, and increases the manufacturing process time and cost of the semiconductor device. In general, more than 40 processes are typically performed to form pads 30 and 33, and therefore enormous time and cost are needed to form pads 30 and 33. Accordingly, a simplified structure for the nonvolatile memory device shown in FIGS. 1 through 4 may be useful for decreasing the manufacturing costs, increasing the level of integration, and enhancing the electrical characteristics of the devices.

SUMMARY OF THE INVENTION

Example embodiments of the present invention provide a semiconductor device having a simple structure using a protection layer to enhance its electrical characteristics. Example embodiments of the present invention further provide methods of manufacturing a semiconductor device having the simple structure using the protection layer.

According to one embodiment of the present invention, a semiconductor device comprises a semiconductor substrate, and a conductive structure formed on the semiconductor substrate, wherein the conductive structure comprises contact regions and gate structures. The device further comprises a protection layer formed on the gate structures, an insulation layer formed on the protection layer, and a plurality of contacts directly contacting the contact regions and the semiconductor substrate through the insulation layer, wherein the contacts have substantially different heights from each other.

According to another embodiment of the present invention, a semiconductor device comprises a semiconductor substrate including a cell area and a peripheral circuit area, a plurality of first gate structures formed in the cell area, and a gate structure formed in the peripheral circuit area. A first protection layer is formed on the first gate structures, a second protection layer is formed on the gate structure in the peripheral circuit area, an insulating interlayer formed in the cell area and the peripheral circuit area, and a plurality of contacts penetrating the insulating interlayer and making contact with the cell area, the peripheral circuit area and the gate structure formed in the peripheral circuit area. The contacts have substantially different heights from one another.

According to another embodiment of the present invention, a method of manufacturing a semiconductor device comprises forming a plurality of gate structures on a semiconductor substrate, forming a contact region in an upper portion of the semiconductor substrate between the gate structures, and forming a preliminary protection layer on the gate structures and the semiconductor substrate. The method further comprises forming an insulation layer on the preliminary protection layer, and forming a plurality of contacts penetrating the insulation layer and directly contacting the contact region and the semiconductor substrate. The contacts have substantially different heights from one another.

According to still another embodiment of the present invention, a method of manufacturing a semiconductor device comprises dividing a semiconductor substrate into a cell area and a peripheral circuit area, forming a plurality of first gate structures in the cell area, forming a gate structure in the peripheral circuit area, and forming a first contact region and a second contact region between the first gate structures in the cell area. The method further comprises forming a protection layer in the cell area and the peripheral circuit area, forming an insulating interlayer on the protection layer, and forming a plurality of contacts penetrating the insulating interlayer and respectively contacting the first contact region, the second contact region, the gate structure in the peripheral circuit area, and a portion of the peripheral circuit area. The contacts have substantially different heights different from one another.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF THE EXEMPLARY EMBODIMENTS

Example embodiments of the invention are described below with reference to the corresponding drawings. These embodiments are presented as teaching examples. The actual scope of the invention is defined by the claims that follow.

In this written description, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, fourth, fifth, sixth, seventh, eighth, etc. may be used herein to describe various elements, components, regions, layers, gate structures, contact holes, contacts and/or bit lines, these elements, components, regions, layers, gate structures, contact holes, contacts and/or bit lines should not be limited by these terms. These terms are only used to distinguish one element, component, region, layer, gate structure, contact hole, contact or bit line from another region, layer, gate structure, contact hole, contact or bit line. Thus, a first element, component, region, layer, gate structure, contact hole, contact or bit line discussed below could be termed a second element, component, region, layer, gate structure, contact hole, contact or bit line without departing from the scope of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1:
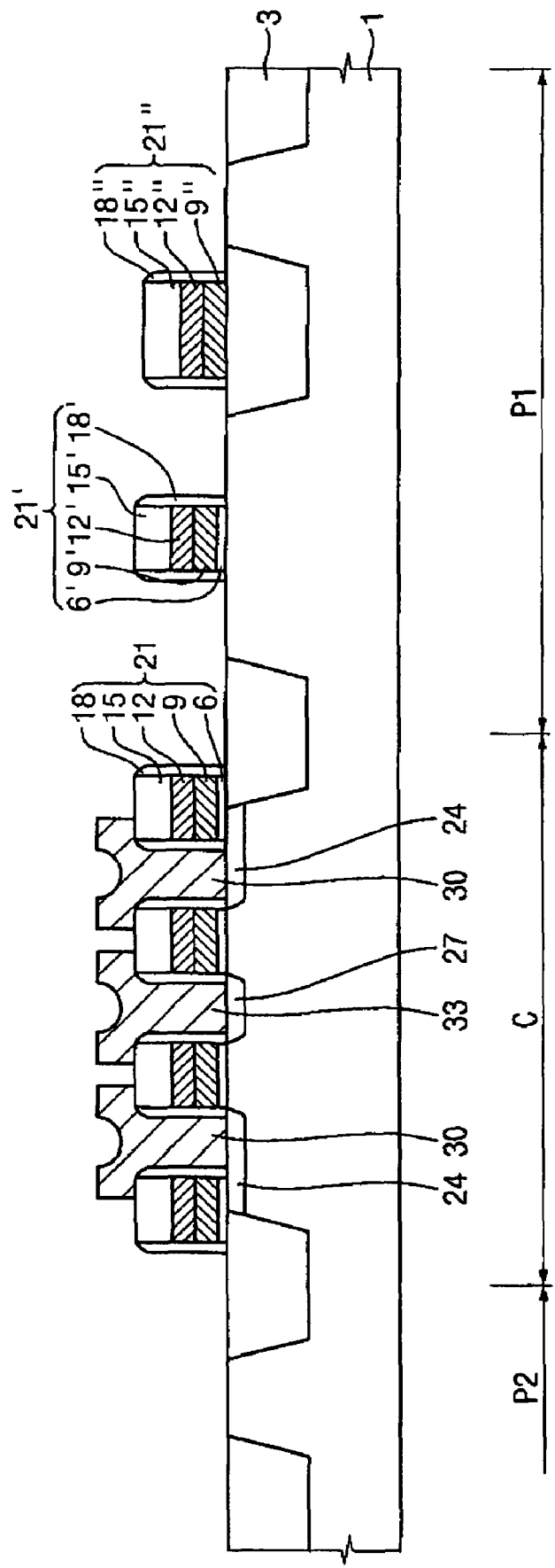
FIGS. 1 through 4 are cross-sectional views illustrating a method of manufacturing a conventional ferroelectric memory device.
Figure 2:
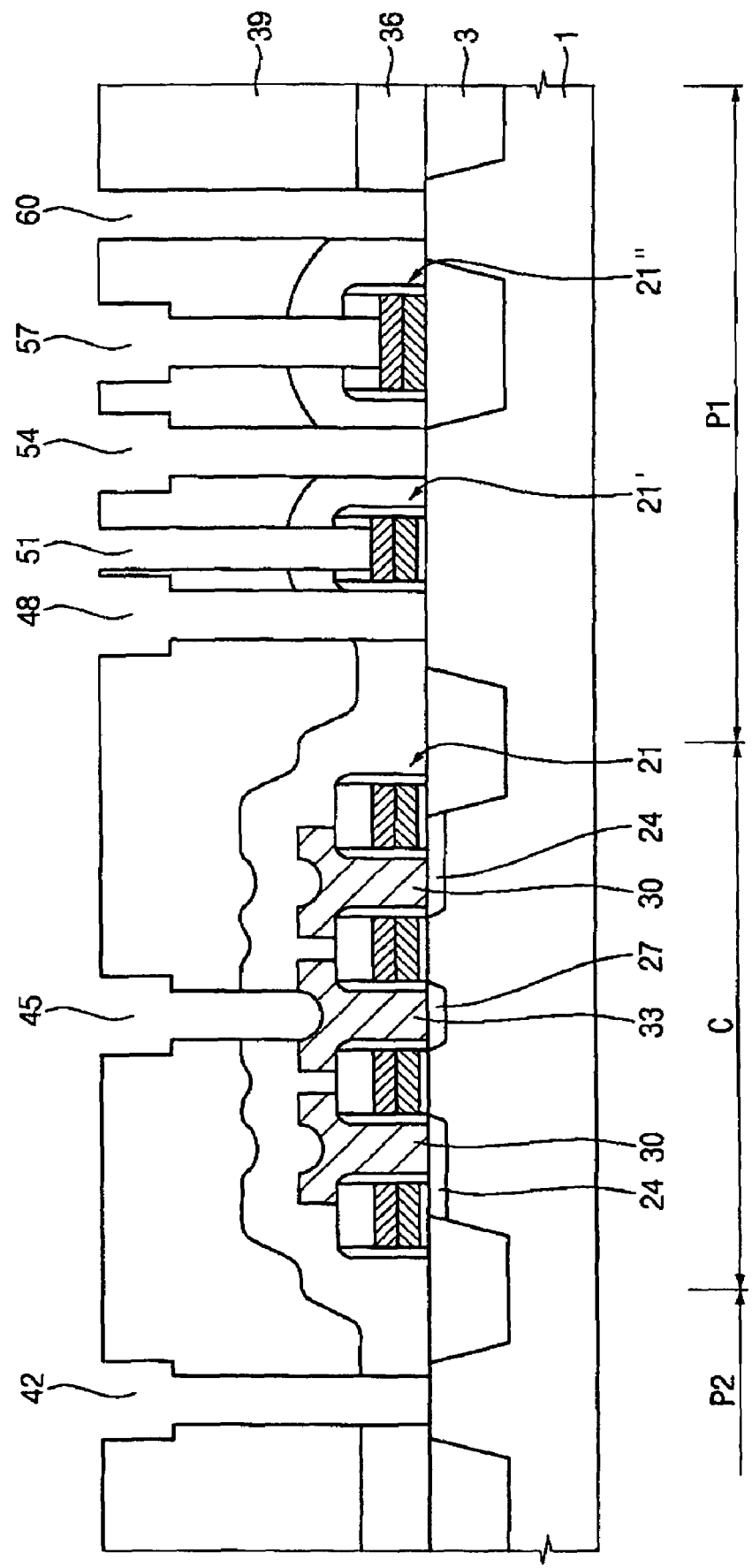
Figure 3:
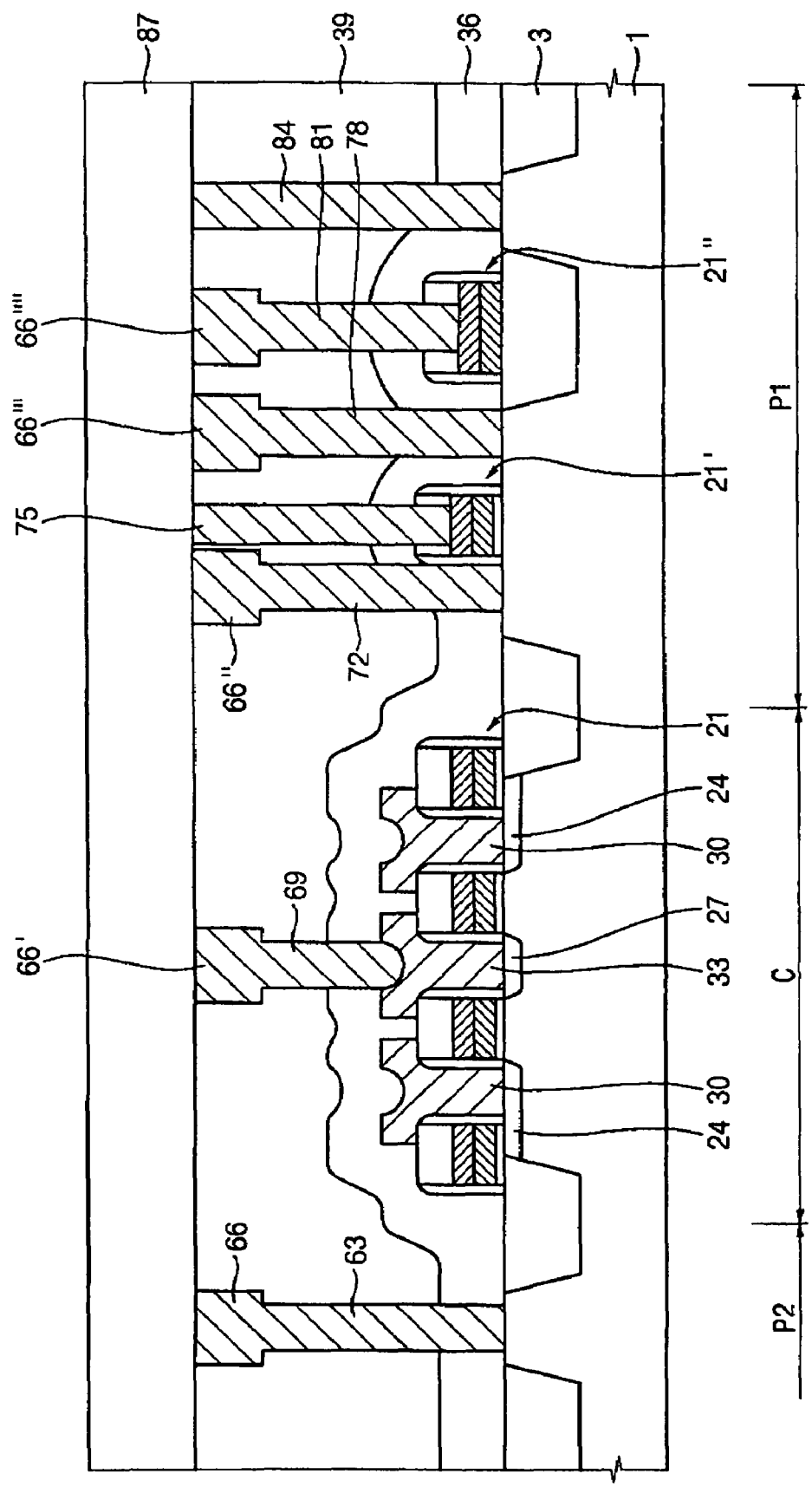
Figure 4:
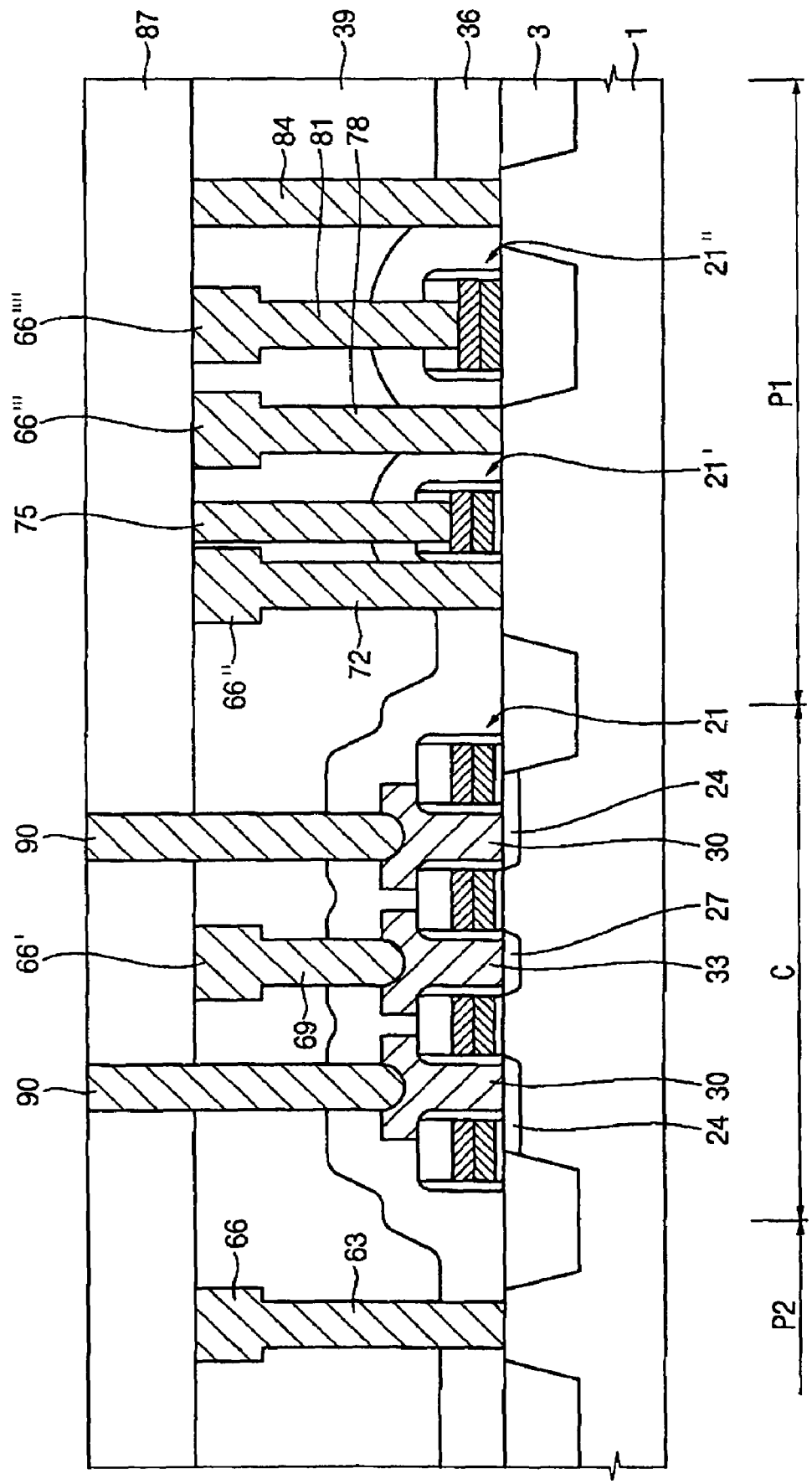
Figure 5:
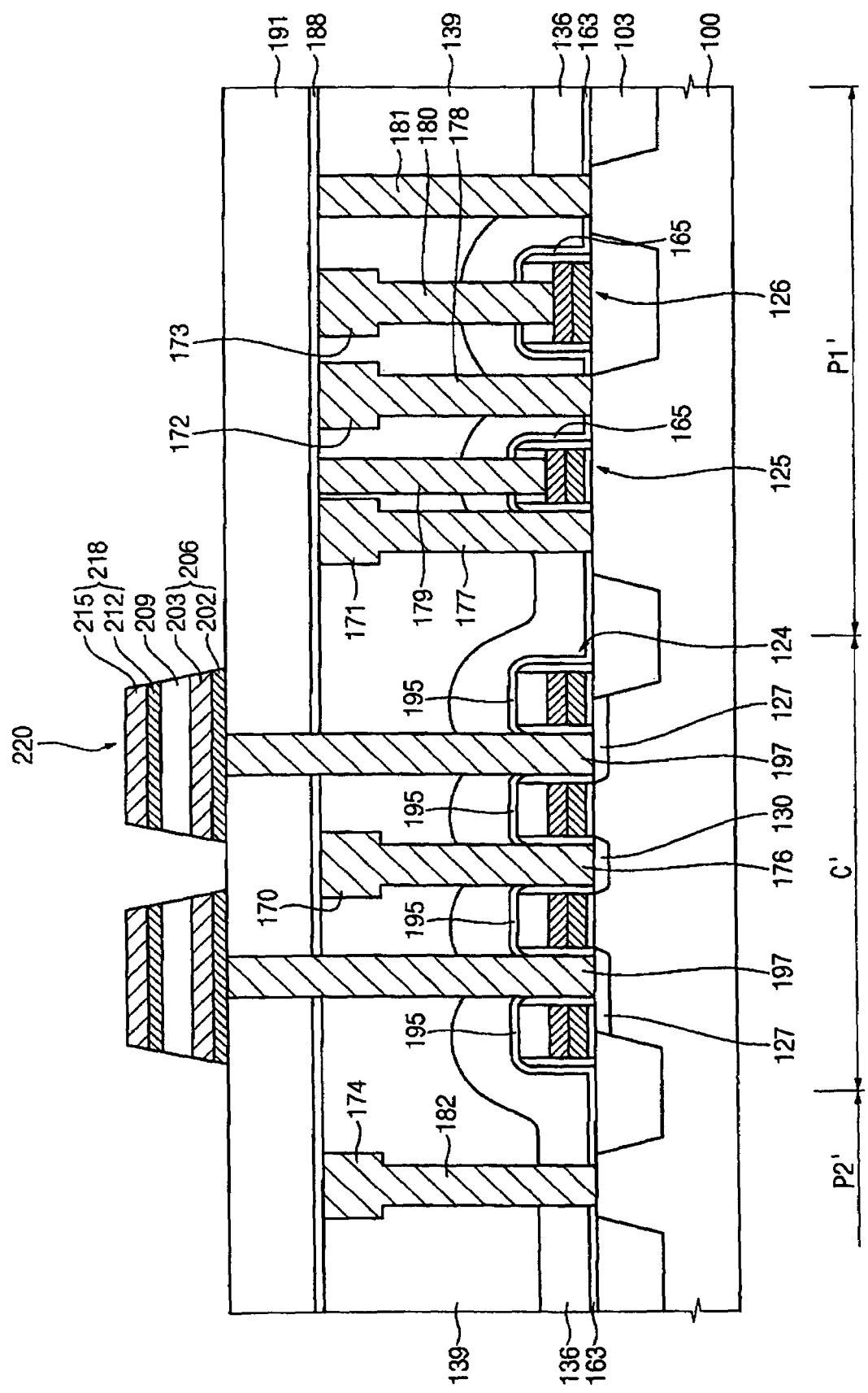
FIG. 5 is a cross-sectional view illustrating a semiconductor device in accordance with one embodiment of the present invention.

FIG. 5 is a cross-sectional view illustrating a semiconductor device in accordance with an example embodiment of the present invention.

Referring to FIG. 5, the semiconductor device includes a semiconductor substrate 100, conductive structures formed on semiconductor substrate 100, protection layers formed on the conductive structures, an insulation structure formed on the protection layers, a plurality of contacts making contact with the conductive structures and semiconductor substrate 100 through the insulation structure, and a capacitor 220 formed on the insulation structure.

Semiconductor substrate 100 may comprise a silicon wafer or a silicon-on-insulator (SOI) substrate. An isolation layer 103 formed at an upper portion of semiconductor substrate 100 divides semiconductor substrate 100 into a cell area C', a first peripheral circuit area P1', and a second peripheral circuit area P2'. First peripheral circuit area P1' and second peripheral circuit area P2' are adjacent to cell area C'. Collectively, first and second peripheral circuit areas P1' and P2' may be referred to as a peripheral circuit area.

The conductive structures include first gate structures 124 formed in cell area C', a first contact region 127, and a second contact region 130. First and second contact regions 127 and 130 are formed on portions of semiconductor substrate 100 between first gate structures 124. First and the second contact regions 127 and 130 generally correspond to source/drain regions. The conductive structures include a second gate structure 125 and a third gate structure 126. Second and third gate structures 125 and 126 are formed in first peripheral circuit area P1'.

A first protection layer 195 is formed on upper faces and sidewalls of first gate structures 124 and first and second contact regions 127 and 130 in cell area C'. A second protection layer 165 is formed on upper faces and sidewalls of second and third gate structures 125 and 126 and semiconductor substrate 100 in first peripheral circuit area P1'. A third protection layer 163 is formed in the second peripheral circuit area P2' of semiconductor substrate 100. Each of first through third protection layers 195, 165 and 163 generally includes a material having an etch selectivity relative to the insulation structure. For example, each of first through third protection layers 195, 165 and 163 may include any one of metal oxide, nitride or oxynitride. First through third protection layers 195, 165 and 163 may prevent first through third gate structures 124, 125 and 126, first and second contact regions 127 and 130, and first and second peripheral circuit areas P1' and P2' of semiconductor substrate 100 from being damaged in a subsequent etching process.

The insulation structure includes a first insulating interlayer 136 and a second insulating interlayer 139. First and the second insulating interlayers 136 and 139 are successively formed on an entire upper face of semiconductor substrate 100 to cover first through third protection layers 195, 165 and 163. In addition, the insulation structure may further include a barrier layer 188 formed on second insulating interlayer 139, and a third insulating interlayer 191 formed on barrier layer 188.

The contacts generally include first through seventh contacts 176, 177, 178, 179, 180, 181 and 182 extending through first and second insulating interlayers 136 and 139, and eighth contacts 197 extending through first through third insulating interlayers 136, 139 and 191. A first bit line 170 is formed on first contact 176, and a second bit line 171 is formed on second contact 177. A third bit line 172 is formed on third contact 178, and a fourth bit line 173 is formed on fifth contact 180. A fifth bit line 174 is formed on seventh contact 182.

Eighth contacts 197 (or "capacitor" contacts) make contact with one of first contact regions 127 through third through first insulating interlayers 191, 139 and 136 without pads or plugs. Lower electrodes 206 of capacitor 220 are formed on eighth contacts 197 so as to be electrically connected with first contact regions 127. First contact 176 makes contact with second contact region 130 through second and first insulating interlayers 139 and 136 without a pad or a plug. First bit line 170 is positioned on first contact 176 so that first bit line 170 is electrically connected to second contact region 130 by first contact 176.

Second and third contacts 177 and 178 make contact with semiconductor substrate 100 adjacent to second gate structure 125 in first peripheral circuit area P1' through second and first insulating interlayers 139 and 136. Second and third bit lines 171 and 172 are formed on second and third contacts 177 and 178, respectively. Fourth and fifth contacts 179 and 180 make contact with respective second and third gate structures 125 and 126 through second and first insulating interlayers 139 and 136.

Fourth bit line 173 is formed on fifth contact 180. However, no bit line is formed on fourth contact 179. Sixth contact 181 makes contact with semiconductor substrate 100 adjacent to third gate structure 126 in first peripheral circuit area P1' through second and first insulating interlayers 139 and 136, and seventh contact 182 makes contact with semiconductor substrate 100 in second peripheral circuit area P2' through second and first insulating interlayers 139 and 136. Fifth bit line 174 is formed on seventh contact 182. However, no bit line is generally formed on sixth contact 181.

Barrier layer 188 of the insulation structure is formed on second insulating interlayer 139 in which first through fifth bit lines 170, 171, 172, 173 and 174 and fourth and sixth contacts 179 and 181 are buried. Barrier layer 188 tends to prevent metal atoms from being diffused into the insulation structure during a thermal treatment process used to form capacitor 220. Accordingly, barrier layer 188 may include a nitride or an oxynitride.

Capacitor 220 includes a lower electrode 206 formed on third insulating interlayer 191 in which eighth contact 197 is buried. Capacitor 220 further includes a ferroelectric layer pattern 209 formed on lower electrode 206, and an upper electrode 218 formed on ferroelectric layer pattern 209.

Lower electrode 206 includes a first lower electrode layer pattern 202 and a second lower electrode layer pattern 203. Upper electrode 218 includes a first upper electrode layer pattern 212 and a second upper electrode layer pattern 215. In the embodiment shown in FIG. 5, capacitor 220 is employed in a FRAM device; however, capacitor 220 could also be employed in a DRAM device or a phase change random access memory (PRAM) device.

FIGS. 6 through 12 are cross-sectional views illustrating a method of manufacturing a semiconductor device in accordance with an exemplary embodiment of the present invention.

Figure 6:
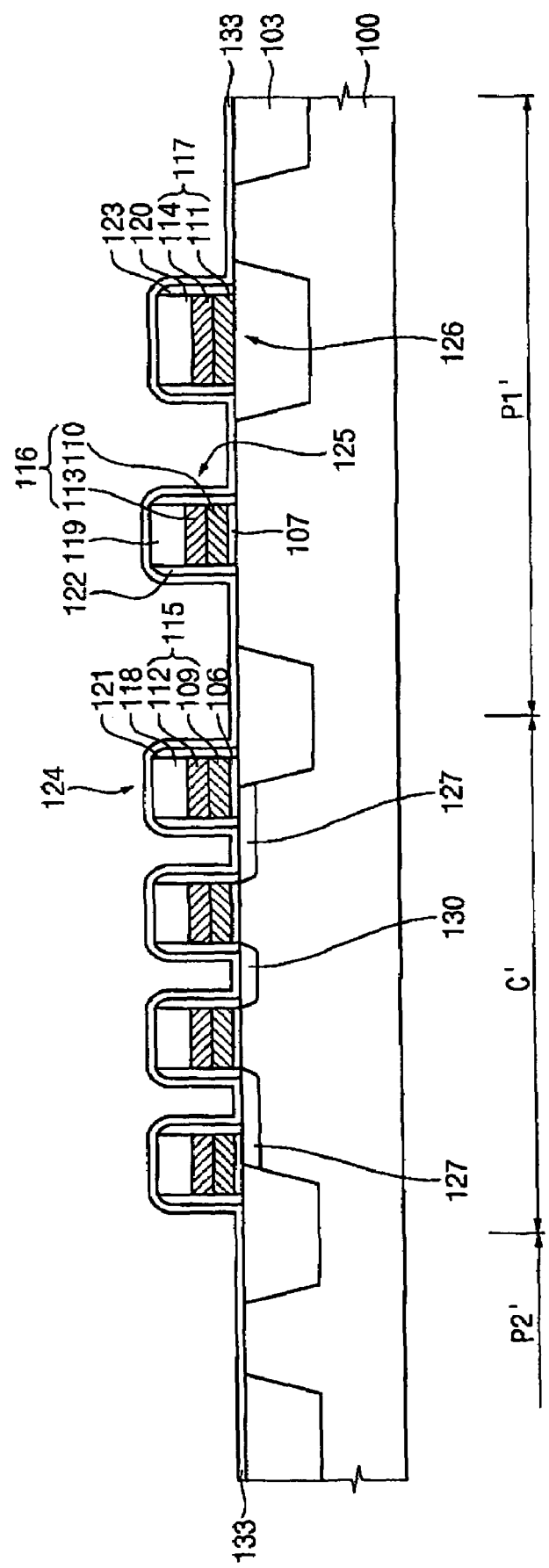
FIGS. 6 to 12 are cross-sectional views illustrating a method of manufacturing a semiconductor device in accordance with one embodiment of the present invention; and, FIG. 13 is a schematic cross-sectional view illustrating types and relative depths of contact holes formed through an insulating interlayer.

Referring to FIG. 6, an isolation layer 103 is formed in an upper portion of a semiconductor device 100 such as a silicon wafer or a silicon-on-insulator (SOI) substrate to divide semiconductor substrate 100 into a cell area C' and a peripheral circuit area. Cell area C' divides the peripheral circuit area is divided into a first peripheral circuit area P1' and a second peripheral circuit area P2'. Peripheral areas P1' and P2' may be used, for example, to form interconnection wirings for a nonvolatile memory device or a volatile memory device such as a SRAM.

Isolation layer 103 may be generally formed by an isolation process such as a shallow trench isolation (STI) process or a local oxidation of silicon (LOCOS) process.

A gate insulation layer is formed on semiconductor substrate 100 and isolation layer 103 using a thermal oxidation process or a chemical vapor deposition (CVD) process. The gate insulation layer may be formed using an oxide such as silicon oxide. However, in some embodiments of the invention, the gate insulation layer may not be formed on isolation layer 103.

A first conductive layer, a second conductive layer, and a first mask layer are successively formed on the gate insulation layer. The first and the second conductive layers may be patterned to form first gate electrodes in cell area C', and a second gate electrode 116 and a third gate electrode 117 in the first peripheral circuit area P1'. The first mask layer may be patterned to form first gate mask patterns 118 in the cell area C', a second gate mask pattern 119 and a third gate mask pattern 120 in first peripheral circuit area P1'.

The first conductive layer may be generally formed using a conductive material such as a metal or polysilicon doped with impurities. The second conductive layer may be formed using a metal silicide. For example, the second conductive layer may be formed using tungsten silicide (WSix). The first mask layer may be formed using a material that has an etch selectivity relative to a protection layer 133 and a first insulating interlayer 136 (see FIG. 7) formed in subsequent processes. For example, where protection layer 133 is formed using silicon oxide and first insulating interlayer 136 is formed using oxide, the first mask layer may be formed with a nitride such as silicon nitride.

After a photoresist pattern is formed on the first mask layer, the first mask layer, the second conductive layer, the first conductive layer, and the gate insulation layer are successively etched using the photoresist pattern as an etching mask. As a result, a plurality of first gate insulation layer patterns 106, a plurality of first gate electrodes 115, and a plurality of first gate mask patterns 118 are successively formed on semiconductor substrate 100 in cell area C'.

A second gate insulation pattern 107, a second gate electrode 116, and a second gate mask pattern 119 are formed in first peripheral circuit area P1', and simultaneously a third gate electrode 117 and a third gate mask pattern 120 are formed in first peripheral circuit area P1'. Second gate insulation pattern 107, second gate electrode 116, and second gate mask pattern 119 are formed in first peripheral circuit area P1' of the semiconductor substrate 100, and third gate electrode 117 and third gate mask pattern 120 are formed on isolation layer 103 in first peripheral circuit area P1'.

Each of first gate electrodes 115 in cell area C' includes a first conductive layer pattern 109 and a second conductive layer pattern 112. First conductive layer pattern 109 may be formed using a conductive material such as a metal or doped polysilicon, and second conductive layer pattern 112 may be formed using a metal silicide. Thus, each of first gate electrodes 115 may have a polycide structure. In an example embodiment of the present invention, first gate electrodes 115 may include a single conductive layer pattern of a metal or doped polysilicon.

Second gate electrode 116 in first peripheral circuit area P1' includes a third conductive layer pattern 110 and a fourth conductive layer pattern 113. Third gate electrode 116 in first peripheral circuit area P1' includes a fifth conductive layer pattern 111 and a sixth conductive layer pattern 114. Third and the fifth conductive layer patterns 110 and 111 are substantially the same as first conductive layer pattern 109, and fourth and sixth conductive layer patterns 113 and 114 are substantially the same as second conductive layer pattern 112. Each of second and third gate electrodes 116 and 117 includes a single conductive layer pattern formed of a metal or doped polysilicon.

A first insulation layer is formed on semiconductor substrate 100 to cover first to third gate mask patterns 118, 119 and 120 in cell area C' and first peripheral circuit area P1'. The first insulation layer may be formed using a nitride such as silicon nitride. The first insulation layer is anisotropically etched to form first through third gate spacers 121, 122 and 123 on sidewalls of respective first through third gate electrodes 115, 116 and 117 and respective first through third gate mask patterns 118, 119 and 120. That is, first gate spacers 121 are formed on the sidewalls of first gate electrodes 115 and first gate mask patterns 118. Second gate spacer 122 is formed on the sidewall of second gate electrode 116 and second gate mask pattern 119. Third gate spacer 123 is formed on the sidewall of third gate electrode 117 and third gate mask pattern 120. Thus, a plurality of first gate structures 124 are formed in cell area C' and a second gate structure 125 and a third gate structure 126 are formed in first peripheral circuit area P1'. Each of first gate structures 124 includes first gate insulation layer pattern 106, first gate electrode 115, first gate mask pattern 118 and first gate spacer 121. Second gate structure 125 includes second gate insulation layer pattern 107, second gate electrode 116, second gate mask pattern 119 and second gate spacer 122. However, third gate structure 126 formed on isolation layer 103 includes third gate electrode 117, third gate mask pattern 120 and third gate spacer 123 without a gate insulation layer pattern.

Referring to FIG. 6, impurities are implanted into a portion of cell area C' exposed between the first gate structures by an ion implantation process using first gate structures 124 as implantation masks, and then a thermal treatment process is performed on semiconductor substrate 100 to form first contact regions 127 and a second contact region 130. For example, first and second contact regions 127 and 130 correspond to source/drain regions. Lower electrodes 206 of a capacitor 220 (see FIG. 12) are electrically connected to first contact regions 127, and a first bit line 170 (see FIG. 10) in the cell area C' is electrically connected to second contact region 130. Accordingly, transistors including first gate structures 124 and first and second contact regions 127 and 130 are formed in cell area C' of semiconductor substrate 100.

According to one example embodiment of the present invention, first impurities having a relatively low concentration are implanted into a portion of semiconductor substrate 100 exposed between first gate structures 124 before first gate spacers 121 are formed on the sidewalls of first gate structures 124. After first gate spacers 121 are formed on the sidewalls of first gate structures 124, second impurities having a relatively high concentration are implanted into semiconductor substrate 100 in which the first impurities are implanted to form first and second contact regions 127 and 130 having lightly doped drain (LDD) structures.

Protection layer 133 is formed on an entire upper face of cell area C' in which first gate structures 124 are formed, and first peripheral circuit area P1' in which second and third gate structures 125 and 126 are formed. Protection layer 133 is formed using a material that has an etch selectivity relative to first, second and third insulating interlayers 136, 139 and 191, which are subsequently formed (see FIG. 10). For example, protection layer 133 is formed using a metal oxide such as aluminum oxide, an oxynitride such as silicon oxynitride, or a nitride such as silicon nitride. Protection layer 133 is generally formed by a CVD process, a plasma enhanced chemical vapor deposition (PECVD) process or an atomic layer deposition (ALD) process.

Figure 8:
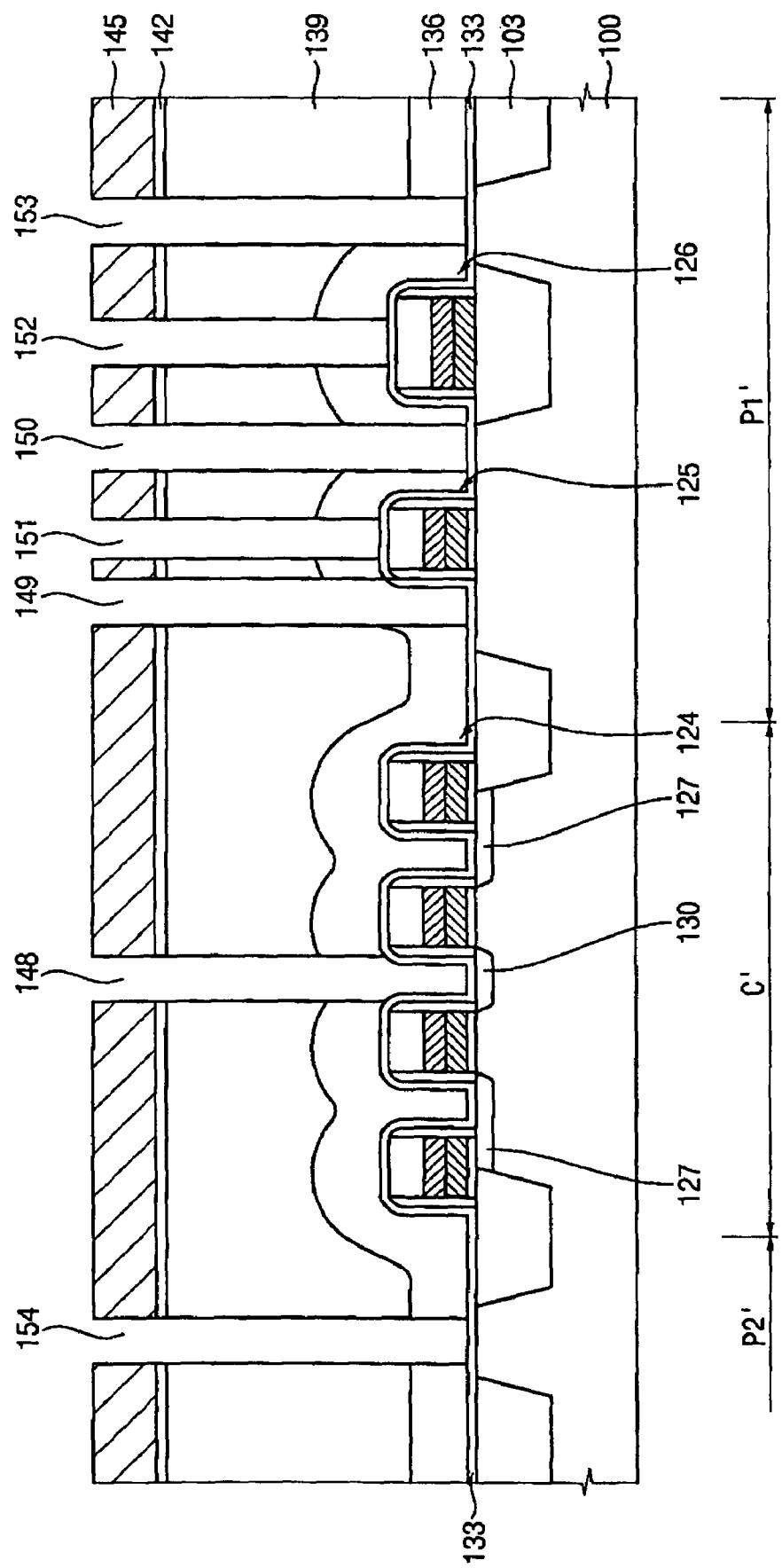

Protection layer 133 is patterned in a subsequent process to form a preliminary first protection layer 164 for protecting first gate structures 124 in cell area C', a second protection layer 165 for protecting second and third gate structures 125 and 126 in first peripheral circuit area P1', and a third protection layer 163 for protecting second peripheral circuit area P2' in an etching process used to form first, second, third, fourth, fifth, sixth and seventh contact holes 148, 149, 150, 151, 152, 153 and 154 (see FIG. 8). Protection layer 133 generally may have a thickness of about 50 Å to 1,000 Å. The thickness of protection layer 133 may vary in accordance with depths of first through seventh contact holes 148, 149, 150, 151, 152, 153 and 154 or thicknesses of first through third insulating interlayers 136, 139 and 191.

Figure 7:
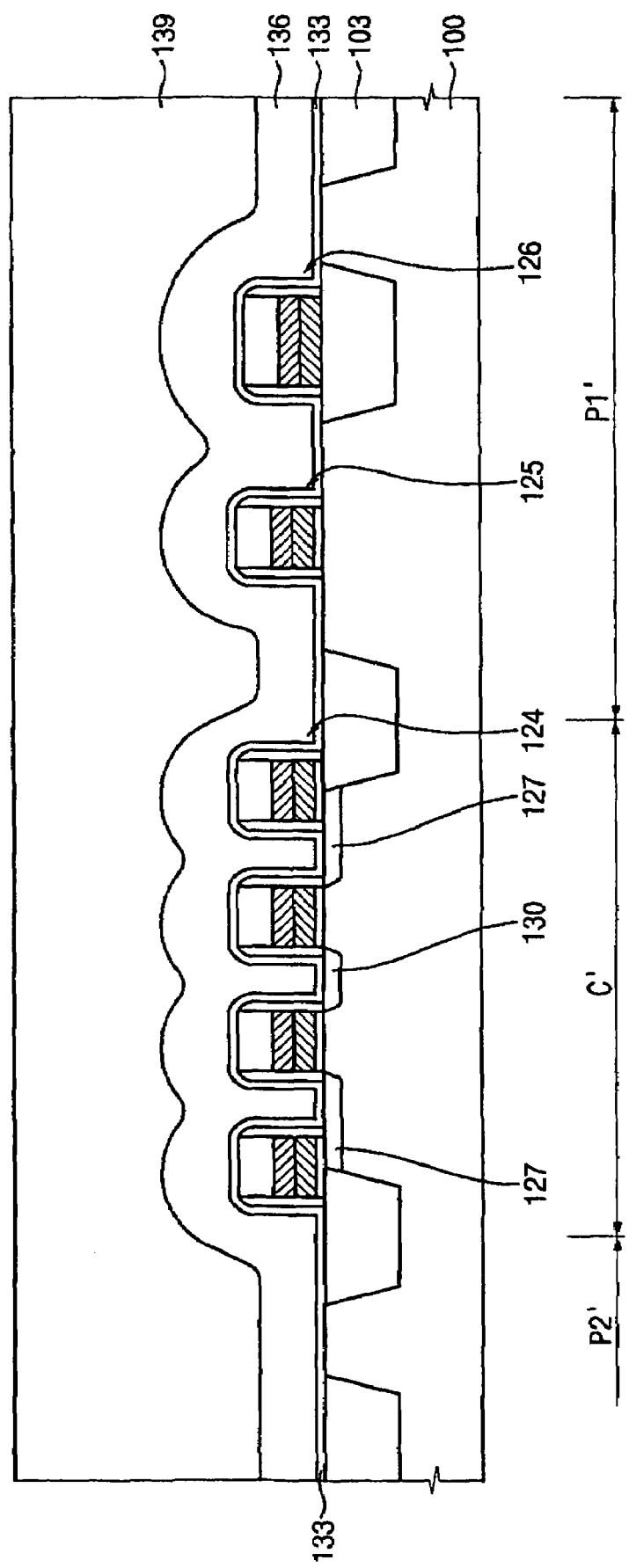

Referring to FIG. 7, first insulating interlayer 136 is formed on semiconductor substrate 100 to cover protection layer 133. For example, first insulating interlayer 136 is generally formed using an oxide such as boro-phosphor silicate glass (BPSG), phosphor silicate glass (PSG), undoped silicate glass (USG), spin on glass (SOG), plasma enhanced-tetraethyl orthosilicate (PE-TEOS), high density plasma-chemical vapor deposition (HDP-CVD) oxide, etc. First insulating interlayer 136 may be generally formed by a CVD process, a PECVD process or an HDP-CVD process. First insulating interlayer 136 is formed to a sufficient height above an upper face of protection layer 133 to completely fill up first gaps between first gate structures 124 and gaps between second and third gate structures 125 and 126.

In one example embodiment of the present invention, first insulating interlayer 136 is formed over semiconductor substrate 100 and first through third gate structures 124, 125 and 126 such that steps are formed at an upper portion of first insulating interlayer 136 in accordance with a profile of the first to the third gate structures 124,125 and 126. The steps may be then planarized using a chemical mechanical polishing (CMP) process, an etch back process or a combination process of a CMP process and an etch back process.

Second insulating interlayer 139 is formed on first insulating interlayer 136. Second insulating interlayer 139 is formed using an oxide such as BPSG, PSG, USG, SOG, PE-TEOS, HDP-CVD oxide, etc by a CVD process, a PE-CVD process or an HDP-CVD process. First and second insulating interlayers 136 and 139 are formed using substantially the same materials, however, first and second insulating interlayers 136 and 139 may be formed using substantially different materials. An upper portion of second insulating interlayer 139 may be planarized by a CMP process, an etch back process, or a combination of a CMP process and an etch back process.

In another example embodiment of the present invention, one of first and second insulating interlayers 136 and 139 is formed over semiconductor substrate 100 and then planarized. In other words, one of first and second insulating interlayers 136 and 139 may be omitted.

Referring to FIG. 8, an anti-reflection layer 142 and a photoresist pattern 145 are sequentially formed on second insulating interlayer 139. For example, anti-reflection layer 142 may be formed using silicon oxide, silicon nitride, or silicon oxynitride. Photoresist pattern 145 is generally formed on anti-reflection layer 142 by a photolithographic process.

Second insulating interlayer 139 and first insulating interlayer 136 are partially etched using photoresist pattern 145 as an etching mask to form first through seventh contact holes 148, 149, 150, 151, 152, 153, and 154 partially exposing protection layer 133 positioned on semiconductor substrate 100. Accordingly, semiconductor substrate 100 or the gate structures formed in the peripheral circuit area may be damaged in an etching process for forming the first through seventh contact holes 148, 149, 150, 151, 152, 153, and 154.

Figure 13:
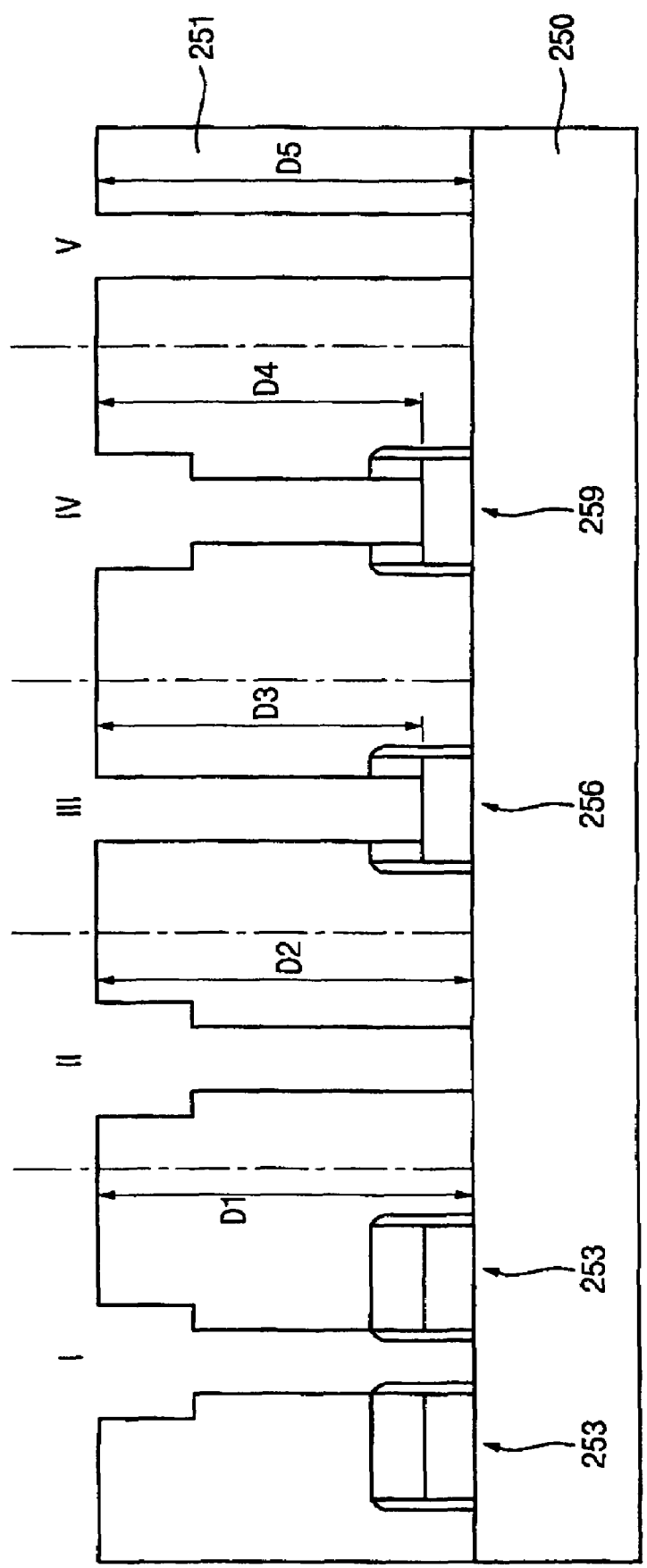

FIG. 13 is a schematic cross-sectional view illustrating types and relative depths of contact holes formed through the insulating interlayer.

Referring to FIG. 13, first through seventh contact holes 148, 149, 150, 151, 152, 153, and 154 formed through second and first insulating interlayers 139 and 136 may be divided into five types. In FIG. 13, a contact hole directly exposing a semiconductor substrate 250 between gate structures 253 in a cell area is classified as a first type contact hole "I", and a depth of a first type contact hole I is represented by "D1". A contact hole directly exposing semiconductor substrate 250 in a peripheral circuit area is classified as a second type contact hole "II", and a depth of a second type contact hole II is represented by "D2". Openings for bit lines are formed are formed at upper portions of the respective first and second type contact holes I and II. Contact holes exposing respective gate electrodes of gate structures 256 and 259 in the peripheral circuit area are respectively classified as a third type contact hole III and a fourth type contact hole IV, and the respective depths of the third and fourth type contact holes III and IV are D3 and D4. An opening for forming a bit line is formed in an upper portion of the fourth type contact hole IV; however, an opening for forming a bit line is not formed at an upper portion of the third type contact hole III. A contact hole directly exposing semiconductor substrate 250 in the cell area or the peripheral circuit area is classified into a fifth type contact hole V, and a depth of the fifth type contact hole V is represented by D5.

As illustrated in FIG. 13, depths D1, D2, D3, D4 and D5 of the first through fifth types of contact holes I, II, III, IV and V are substantially different from one another. Therefore, different portions of semiconductor substrate 250 exposed by etching processes used to form the first type through fifth type contact holes I, II, III, IV and V through insulating interlayer 251 may be damaged. For example, gate structures 256 and 259 in the peripheral circuit area include gate mask patterns having an etch selectivity relative to insulating interlayer 251 to prevent damage to gate structures 256 and 259 in the etching process used to form first type through fifth type contact holes I, II, III, IV and V. However, portions of semiconductor substrate 250 directly exposed by the etching processes used to forming first, second, and fifth type contact holes I, II and V may be not protected, and thus may be easily damaged by the etching processes. When a contact region of semiconductor substrate 250 is damaged, the contact region thus damaged may be restored by another ion implantation process. However, these processes may require more than ten steps to restore the contact region. Thus, restoring damaged portions of semiconductor substrate 250 can significantly increase the time and cost of a semiconductor manufacturing process.

Referring again to FIG. 8, first contact hole 148 is formed over semiconductor substrate 100 between first gate structures 124 in cell area C', and second and third contact holes 149 and 150 are formed over semiconductor substrate 100 adjacent to second gate structure 125 in first peripheral circuit area P1'. Fourth contact hole 151 is formed over second gate structure 125 in first peripheral circuit area P1', fifth contact hole 152 is formed over third gate structure 126 in first peripheral circuit area P1' and sixth contact hole 153 is formed over semiconductor substrate 100 adjacent to third gate structure 126. Seventh contact hole 154 is formed in second peripheral circuit area P2' of semiconductor substrate 100.

Referring to FIGS. 8 and 13, first contact hole 148 can be classified as a first type contact hole I and second, third and seventh contact holes 149, 150 and 154 can be classified as second type contact holes II. In addition, fourth contact hole 151 may be classified as a third type contact hole III, and fifth contact hole 152 may be classified as a fourth type contact hole IV. Sixth contact hole 153 may be classified as a fifth type contact hole V.

As described above, protection layer 133 is formed over an entire surface of semiconductor substrate 100 including cell area C' and respective first and second peripheral circuit areas P1' and P2' in the etching process for forming the first through seventh contact holes 148, 149, 150, 151, 152, 153 and 154. Hence, semiconductor substrate 100 is not exposed in the etching process. Accordingly, protection layer 133 prevents semiconductor device 100 from being damaged in the etching process, and furthermore, may effectively prevent second contact region 130 in cell area C' of semiconductor substrate 100 from being damaged.

Figure 9:
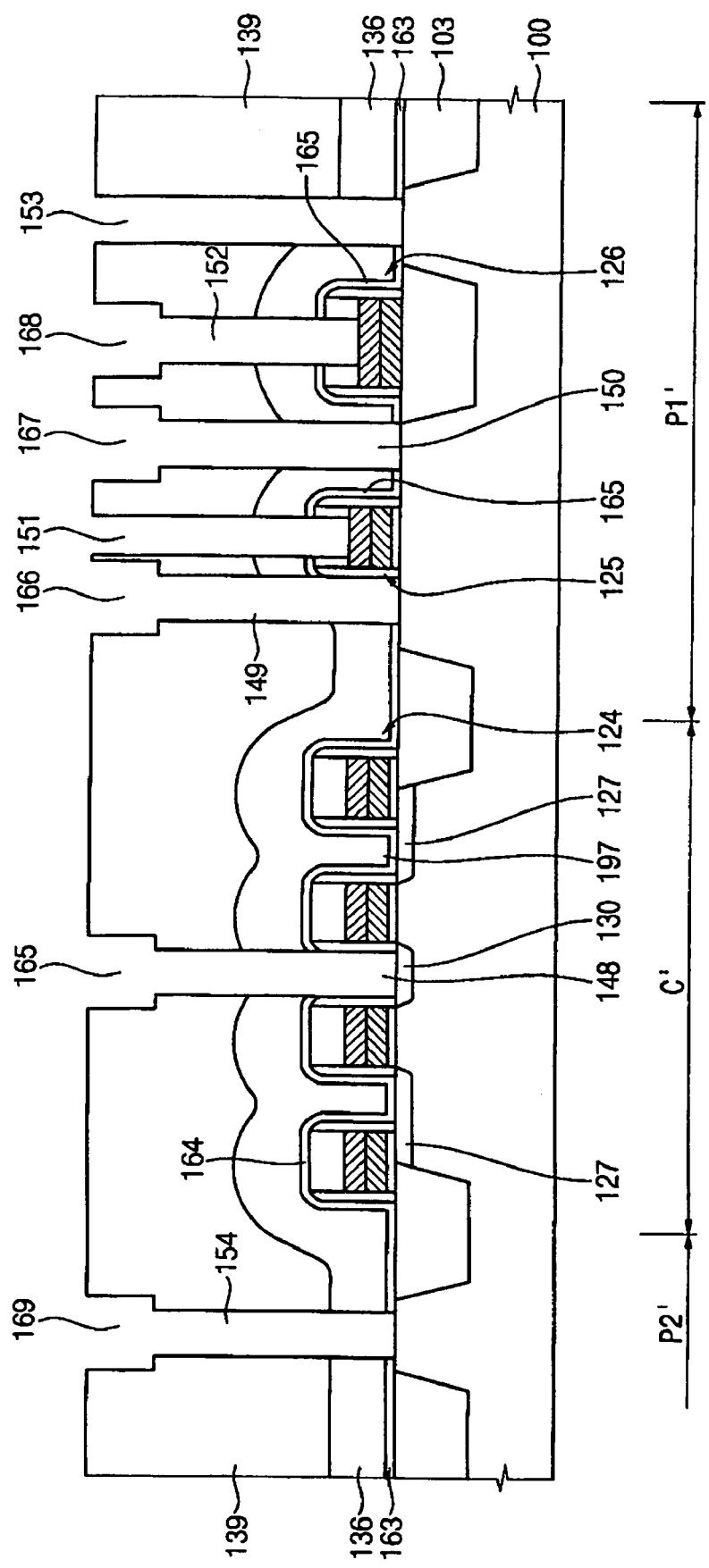

Referring to FIG. 9, a photoresist pattern (not shown) is formed on second insulating interlayer 139. Then, upper portions of second insulating interlayer 139 above first, second, third, fifth and seventh contact holes 148, 149, 150, 152 and 154 are etched using the photoresist pattern as an etching mask. As a result, a first opening 165, a second opening 166, a third opening 167, a fourth opening 168 and a fifth opening 169 are respectively formed at upper portions of first, second, third, fifth and seventh contact holes 148, 149, 150, 152, and 154. In the etching process used to form first through fifth openings 165 through 169, no additional opening is formed at upper portions of fourth and sixth contact holes 151 and 153.

Portions of protection layer 133 exposed through first through seventh contact holes 148, 149, 150, 151, 152, 153 and 154 are etched to form preliminary first protection layer 164 in cell area C' and second protection layer 165 in first peripheral circuit area P1'. At the same time, third protection layer 163 is formed in second peripheral circuit area P2'. Preliminary first protection layer 164 is formed on upper faces and sidewalls of first gate structures 124 in cell area C'. Preliminary first protection layer 164 is also formed on first contact regions 127 in cell area C' of semiconductor substrate 100. Second protection layer 165 is formed on upper faces and sidewalls of second and third gate structures 125 and 126 in first peripheral circuit area P1'. Second protection layer 165 is also formed adjacent to second and third gate structures 125 and 126 in first peripheral circuit area P1' of semiconductor substrate 100. Fourth and fifth contact holes 151 and 152 are formed through second and third gate mask patterns 119 and 120 so that second protection layer 165 is not formed on a central portion of second and third gate structures 125 and 126. Third protection layer 163 is formed on the second peripheral circuit area P2' of semiconductor substrate 100.

Figure 10:
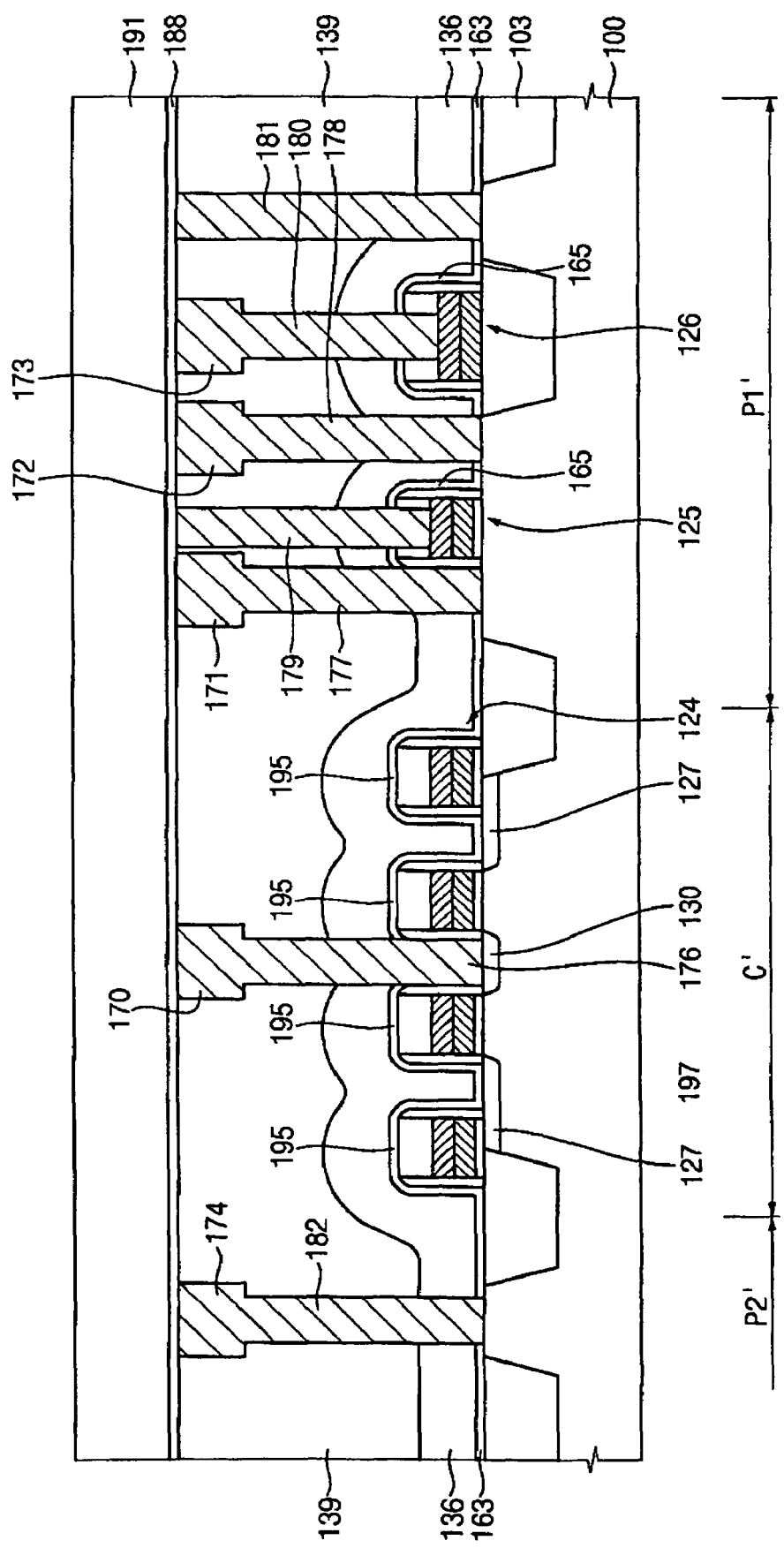

Referring to FIG. 10, a third conductive layer is formed on second insulating interlayer 139 to fill first through seventh contact holes 148, 149, 150, 151, 152, 153 and 154, and first through fifth openings 165, 166, 167, 168 and 169. The third conductive layer is typically formed using a metal or a conductive metal nitride by a sputtering process, a CVD process, a pulse laser deposition (PLD) process or an ALD process. For example, the third conductive layer may be formed using tungsten, aluminum, titanium, copper, tungsten nitride, aluminum nitride, titanium nitride, etc.

The third conductive layer is partially removed by a CMP process, an etch back process or a combination process of a CMP process and an etch back process until second insulating interlayer 139 is exposed. Thus, a first bit line 170 and a first contact 176 are formed in first opening 165 and first contact hole 148 in cell area C', respectively. A second bit line 171 and a second contact 177 are formed in second opening 166 and second contact hole 149 in first peripheral circuit area P1', respectively. A third bit line 172 and a third contact 178 are formed in third opening 167 and third contact hole 150 in first peripheral circuit area P1', respectively. A fourth contact 179 and a sixth contact 181 are formed in fourth and sixth contact holes 151 and 153 in first peripheral circuit area P1', respectively, and a fourth bit line 173 and a fifth contact 180 are formed in fourth opening 168 and fifth contact hole 152 in first peripheral circuit area P1', respectively. A fifth bit line 174 and a seventh contact 182 are formed in fifth opening 169 and seventh contact hole 154 in second peripheral circuit area P2', respectively.

First contact 176 in cell area C' makes contact with second contact region 130, and first bit line 170 is electrically connected to second contact region 130 by first contact 176. In first peripheral circuit area P1', second and third bit lines 171 and 172 are connected to semiconductor substrate 100 by second and third contacts 177 and 178; however, no bit line is formed on sixth contact 181. In addition, fourth bit line 173 in first peripheral circuit area P1' is electrically connected to third gate electrode 117 of third gate structure 126 by fifth contact 180. Fourth contact 179 makes contact with second gate electrode 116 of second gate structure 125; however, no bit line is formed on fourth contact 179. In second peripheral circuit area P2', fifth bit line 174 is electrically connected to semiconductor substrate 100 by seventh contact 182.

Referring again to FIG. 10, a barrier layer 188 is formed on first through fifth bit lines 170, 171, 172, 173 and 174, fourth and sixth contacts 179 and 181, and second insulating interlayer 139. Barrier layer 188 is typically formed using an oxynitride or a metal nitride by a sputtering process, an ALD process, a PLD process or a CVD process. For example, barrier layer 188 is commonly formed using silicon oxynitride. Barrier layer 188 tends to prevent metal atoms in bit lines 170, 171, 172, 173 and 174 and/or contacts 179 and 181 from being diffused into third insulating interlayer 191 in a subsequent thermal treatment process.

Third insulating interlayer 191 is formed on barrier layer 188. Third insulating interlayer 191 is typically formed using an oxide by a CVD process, a PECVD process or an HDP-CVD process. For example, third insulating interlayer 191 is often formed using BPSG, PSG, USG, SOG, PE-TEOS, HDP-CVD oxide, etc. Third insulating interlayer 191 is often formed using substantially the same material as first insulating interlayer 136 and/or second insulating interlayer 139. However, third insulating interlayer 191 can also be formed using a material substantially different from first and/or second insulating interlayers 136 and 137.

Figure 11:
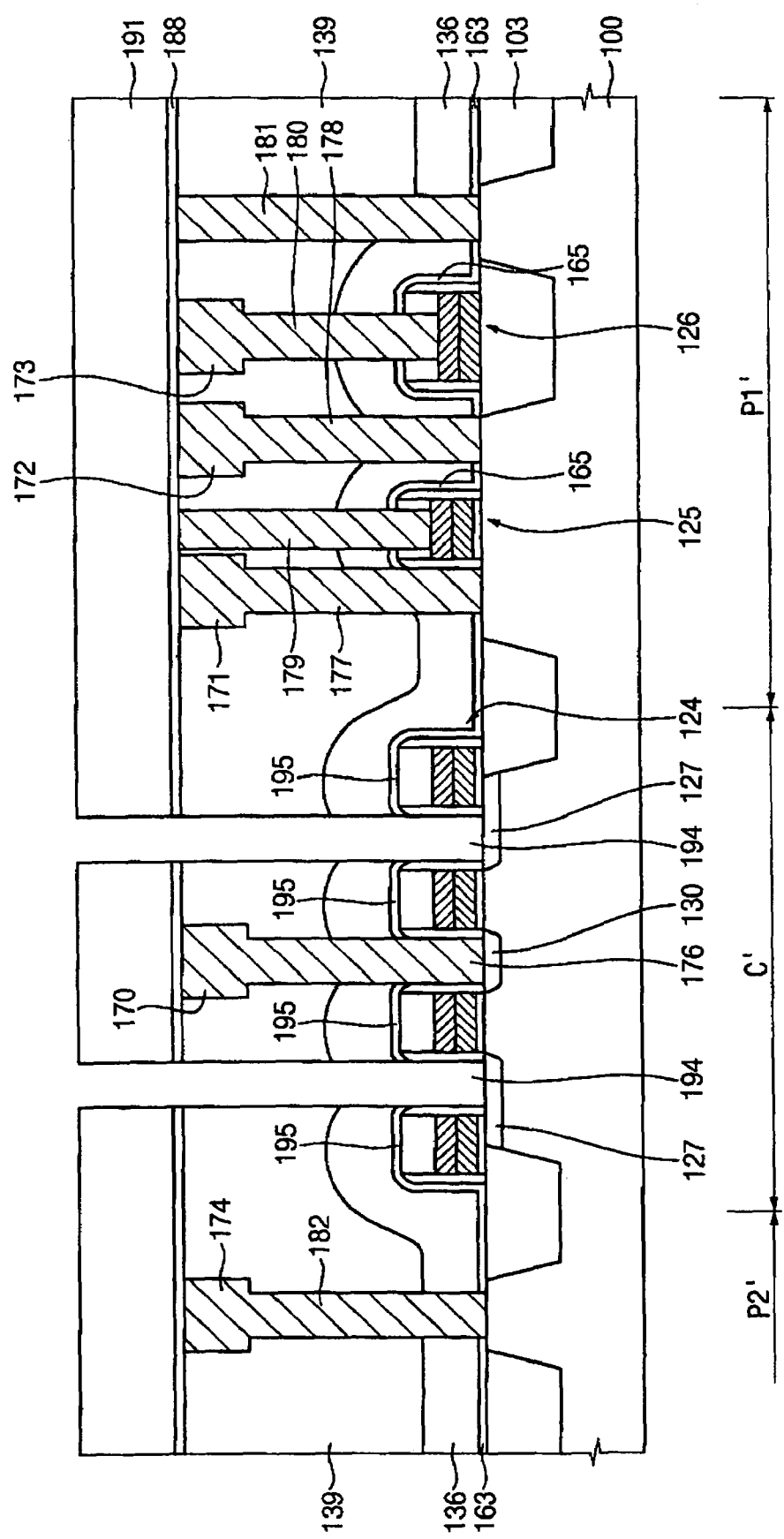

Referring to FIG. 11, a photoresist pattern (not shown) is formed on third insulating interlayer 191, and then third insulating interlayer 191, barrier layer 188, second insulating interlayer 139, and first insulating interlayer 136 are etched using the photoresist pattern as an etching mask until preliminary protection layer 164 in cell area C' is partially exposed. Thus, eighth contact holes 194 are formed to partially expose preliminary protection layer 164 on first contact regions 127. Each of eighth contact holes 194 can be classified as a fifth type contact hole V as illustrated in FIG. 13. As described above, first contact regions 127 in cell area C' are protected from being damaged in an etching process used to form eighth contact holes 194 by preliminary protection layer 164.

Subsequently, portions of preliminary protection layer 164 exposed in cell area C' are etched to expose first contact regions 127. As a result, a first protection layer 195 remains in cell area C'.

First protection layer 195 is formed on first gate structures 124. In particular, first protection layer 195 is also formed on sidewalls of first gate structures 124 positioned at a peripheral portion of cell area C'. Thus, first through third protection layers 195, 165 and 163 are formed on the entire surface of semiconductor substrate 100 except for portions of semiconductor substrate 100 on which first through eighth contacts 176, 177, 178, 179, 180, 181, 182 and 197 are formed. In one exemplary embodiment of the present invention, an additional anti-reflection layer is formed on third insulating interlayer 191 to ensure a process margin in a photolithography process. In another exemplary embodiment of the present invention, an additional cleaning process is performed on semiconductor substrate 100 to remove a native oxide layer, polymers or residual impurities from first contact regions 127 after the formation of eighth contact holes 194.

Figure 12:
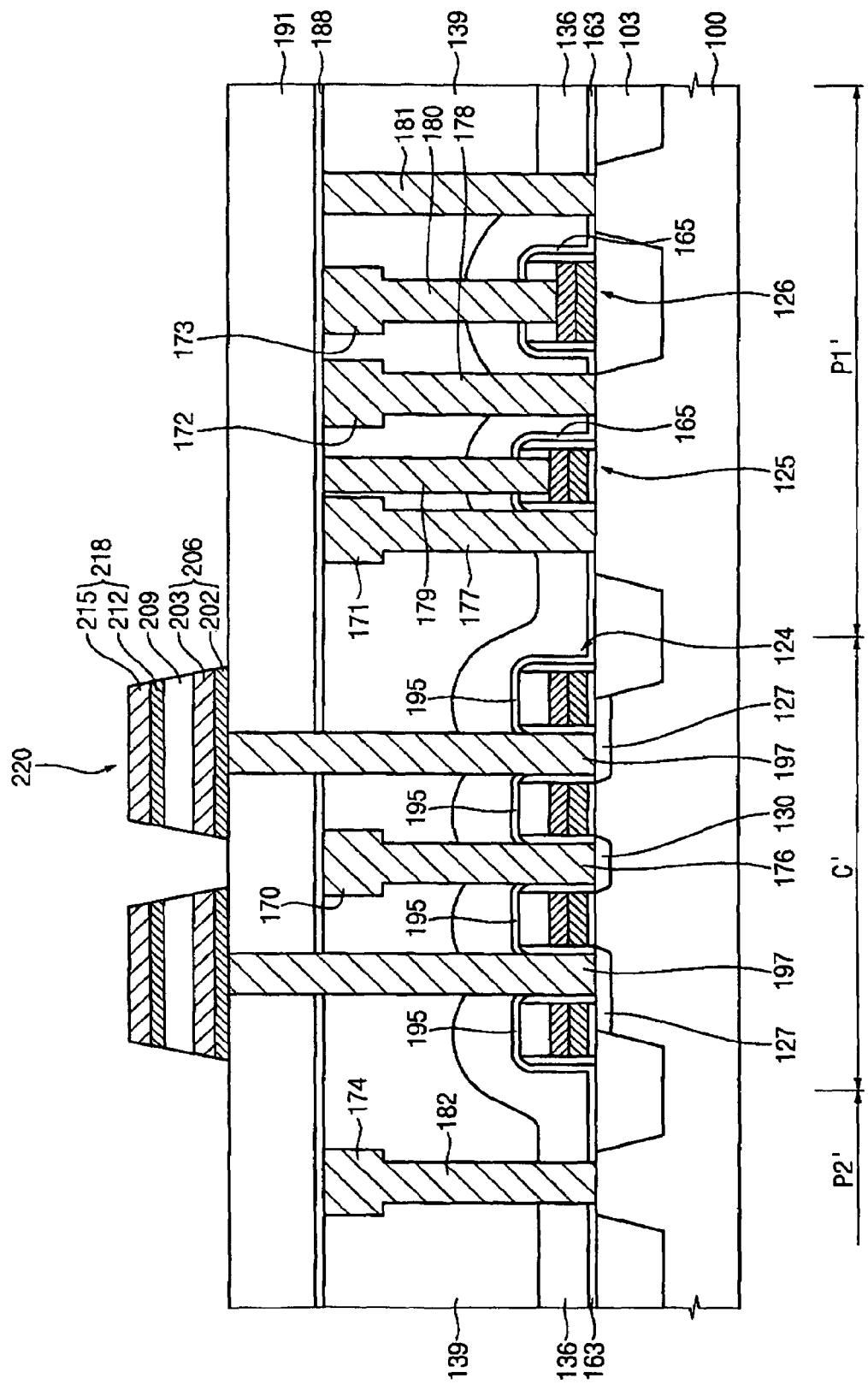

Referring to FIG. 12, a fourth conductive layer is formed on third insulating interlayer 191 to fill eighth contact holes 194, and then the fourth conductive layer is partially removed by a CMP process, an etch back process, or a combination of a CMP process and an etch back process until an upper face of third insulating interlayer 191 is exposed. Thus, eighth contacts 197 are formed in respective eighth contact holes 194. Eighth contacts 197 may be formed using a metal such as tungsten, aluminum, titanium or copper, or polysilicon doped with impurities. Eighth contacts 197 electrically connect lower electrodes 206 subsequently formed to first contact regions 127. That is, lower electrodes 206 are electrically connected to first contact regions 127 by eighth contacts 197.

First and a second lower electrode layers are successively formed on eighth contacts 197 and third insulating interlayer 191. The first lower electrode layer may be formed using a metal nitride by a CVD process, a sputtering process or an ALD process, and the second lower electrode layer may be formed using a metal by a sputtering process, a PLD process or an ALD process. For example, the first and the second lower electrode layers are typically formed using titanium aluminum nitride and iridium.

A ferroelectric layer is formed on the second lower electrode layer by a metal organic chemical vapor deposition (MOCVD) process, a sol-gel process or an ALD process.

First and second upper electrode layers are sequentially formed on the ferroelectric layer. The first upper electrode layer is typically formed using a metal oxide doped with copper, lead or bismuth by a sputtering process, a PLD process or an ALD process. The second upper electrode layer may be formed using a metal by a sputtering process, a PLD process or an ALD process. For example, the first and the second upper electrode layers are commonly formed using strontium ruthenium oxide and iridium, respectively.

After the second upper electrode layer is formed, a rapid thermal process (RTP) may be performed on the ferroelectric layer and the first upper electrode layer under an atmosphere including an oxygen gas or a nitrogen gas.

A photoresist pattern (not shown) is formed on the second upper electrode layer, and then the second upper electrode layer, the first upper electrode layer, the ferroelectric layer, the second lower electrode layer and the first lower electrode layer are successively patterned using the photoresist pattern as an etching mask to form a ferroelectric capacitor including lower electrode 206, a ferroelectric layer pattern 209 and an upper electrode 218. Lower electrode 206 includes respective first and second lower electrode layer patterns 202 and 203 formed on third insulating interlayer 191 and eighth contacts 197. Upper electrode 218 includes first and second upper electrode layer patterns 212 and 215 successively formed on ferroelectric layer pattern 209. Ferroelectric capacitor 220 includes a sidewall inclined by an angle of about 50° to about 80° relative to a horizontal plane of semiconductor substrate 100.

Although not illustrated in drawings, an additional insulating interlayer and an upper wiring may be formed on third insulating interlayer 191 to cover capacitor 200 and complete the semiconductor device.

According to various embodiments of the present invention, a contact connected to a lower electrode of a capacitor is formed in direct contact with a contact region within a semiconductor substrate without a pad between the contact and the contact region. The contact is formed without damaging the contact region by using a protection layer to protect the contact region. As a result, electrical characteristics of a semiconductor device including the contact and the contact region are enhanced and the structure of the semiconductor device is simplified.

Furthermore, the protection layer also may protect various regions of the semiconductor substrate and associated conductive structures in an etching process used to form a plurality of contact holes having different depths. Thus, the contact holes exposing the various regions and the conductive structures may be simply formed in an insulation layer without damage to the semiconductor substrate and the conductive structures. Therefore, a semiconductor device including contacts and bit lines formed in the contact holes may have enhanced electrical characteristics, and time and cost of a semiconductor manufacturing process may be greatly reduced.

The foregoing embodiments are teaching examples. Those of ordinary skill in the art will, understand that various changes in form and details may be made to the example embodiments without departing from the scope of the present invention as defined by the following claims.

What is claimed is:

1. A method of manufacturing a semiconductor device, the method comprising:
   forming a plurality of first gate structures in a cell area of a semiconductor substrate, and other gate structures in a peripheral circuit area of the semiconductor substrate;
   forming contact regions in an upper portion of the cell area of the semiconductor substrate between adjacent ones of the first gate structures;

forming a protection layer on the cell area and peripheral circuit area of the semiconductor substrate to directly contact the first gate structures and other gate structures and the contact regions;

forming an insulation structure on the protection layer; and, forming a plurality of contacts, including a first plurality of contacts respectively extending through the insulation structure and the protection layer to directly contact one of the contact regions and one of the first gate structures in the cell area, and a second plurality of contacts respectively extending through the insulation structure and the protection layer to directly contact either one of the other gate structures or a portion of the semiconductor substrate in the peripheral circuit area, wherein the plurality of contacts includes contacts having substantially different heights, wherein forming the plurality of contacts comprises:

forming a plurality of contact holes extending through the insulation structure to expose portions of the protection layer;

etching the exposed portions of the protection layer to expose respectively, the one contact region and sidewalls of the first gate structures in the cell area, the portion of the semiconductor substrate in the peripheral circuit area, and one of the other gate structures; and filling the plurality of contact holes with a conductive material.

2. The method of claim 1, further comprising; before the formation of the plurality of contact holes, forming an anti-reflection layer and a photoresist pattern on the insulation structure;

wherein forming the plurality of contact holes comprises etching the insulation structure using the photoresist pattern as an etching mask.

3. The method of claim 1, further comprising:

after forming the plurality of contacts, forming a barrier layer on the insulation structure.

4. The method of claim 1, further comprising:

forming a ferroelectric capacitor on the insulation structure, such that the ferroelectric capacitor is electrically connected to one of the first plurality of contacts.

5. A method of manufacturing a semiconductor device, the method comprising:

dividing a semiconductor substrate into a cell area and a peripheral circuit area;

forming a plurality of first gate structures in the cell area;

forming other gate structures in the peripheral circuit area;

forming a first contact region and a second contact region between adjacent ones of the plurality of first gate structures;

forming a protection layer on the cell area and the peripheral circuit area, to directly contact the first and second contact regions, the plurality of first gate structures, and the other gate structures;

forming an insulation structure on the protection layer; and, forming a plurality of contacts, including a first plurality of contacts respectively extending through the insulation structure and the protection layer to directly contact either the first contact region or the second contact region and the first gate structures, and a second plurality of contacts respectively extending through the insulation structure and the protection layer to directly contact one of the other gate structures or a portion of the semiconductor substrate in the peripheral circuit area, wherein the plurality of contacts includes contacts having substantially different heights, wherein forming the plurality of contacts comprises:

forming a first contact hole through the insulation structure to expose portion of the protection layer;

etching the exposed portions of the protection layer to expose the second contact region and sidewalls of the first gate structures adjacent to the second contact region; and forming a first contact by filling the first contact hole with a first conductive material, wherein formation of the first contact forms a preliminary first protection layer from a portion of the protection layer covering the cell area, the preliminary first protection layer directly contacting at least respective upper surface portions of the plurality of first gate structures and the first contact region directly contacting the sidewalls of the first gate structures adjacent to the second contact region.

6. The method of claim 5, wherein forming the insulation structure comprises:

forming a first insulating interlayer to fill gaps between adjacent ones of the plurality of first gate structures and between the other gate structures; and, forming a second insulating interlayer on the first insulating interlayer.

7. The method of claim 6, further comprising:

forming a barrier layer on the second insulating interlayer; and forming a third insulating interlayer on the barrier layer.

8. The method of claim 5, wherein forming the first contact hole comprises:

forming a first opening in an upper portion of the first contact hole such that filling the first contact hole having the first opening with the first conductive material forms a first bit line integrally connected to the first contact.

9. The method of claim 5, wherein forming the plurality of contacts further comprises:

forming a capacitor contact hole extending through the third insulating interlayer, the barrier layer, the insulation structure, and the preliminary first protection layer to expose the first contact region and the sidewalls of the first gate structures adjacent to the first contact region; and, forming a capacitor contact by filling the capacitor contact hole with a second conductive material.

10. The method of claim 9, further comprising:

forming a ferroelectric capacitor on the third insulating interlayer, such that the ferroelectric capacitor is electrically connected to the capacitor contact.

11. The method of claim 5, wherein the other gate structures in the peripheral circuit area comprise a second gate structure and a third gate structure, and forming the plurality of contacts further comprises:

forming a second contact hole extending through the insulation structure and the protection layer to expose a portion of the semiconductor substrate in the peripheral circuit area and a sidewall of the second gate structure; and, forming a second contact by filling the second contact hole with the first conductive material.

12. The method of claim 11, wherein forming the second contact further comprises:

forming a second opening in an upper portion of the second contact hole, such that filling the second contact hole having the second opening with the first conductive material forms a second bit line integrally connected to the second contact.

13. The method of claim 11, wherein forming the plurality of contacts further comprises:
forming a third contact hole extending through the insulation structure and the protection layer to contact a portion of the semiconductor substrate between the second and third gate structures, and filling the third contact hole with the first conductive material to form a third contact.

14. The method of claim 13, wherein forming the third contact further comprises:
forming a third opening in an upper portion of the third contact hole, such that filling the third contact hole having the third opening with the first conductive material forms a third bit line integrally connected to the third contact.

15. The method of claim 11, wherein forming the plurality of contacts further comprises:
forming a fourth contact hole and a fifth contact hole extending through the insulation structure and the protection layer to respectively contact upper portions of the second and third gate structures, and filling the fourth and fifth contact holes with the first conductive material to form fourth and fifth contacts.

16. The method of claim 11, wherein forming the plurality of contacts further comprises:
forming sixth and seventh contact holes extending through the insulation structure and the protection layer to expose respective portions of the semiconductor substrate in the peripheral circuit area, and filling the sixth and seventh contact holes with the first conductive material to form sixth and seventh contacts.

17. The method of claim 5, wherein the first contact on the second contact region and the second plurality of contacts on the peripheral circuit area are simultaneously formed.

18. A method of manufacturing a semiconductor device, the method comprising:
forming a plurality of first gate structures in a cell area of a semiconductor substrate, and other gate structures in a peripheral circuit area of the semiconductor substrate;
forming contact regions in an upper portion of the cell area of the semiconductor substrate between adjacent ones of the first gate structures;
forming a protection layer on the cell area and peripheral circuit area of the semiconductor substrate to directly contact the first gate structures and other gate structures and the contact regions;
forming an insulation structure on the protection layer, wherein forming the insulation structure comprises:
forming a first insulating interlayer on the protection layer to fill respective gaps between adjacent first gate structures and between the other gate structures;
forming a second insulating interlayer on the first insulating interlayer; and
planarizing an upper surface of the second insulating interlayer;
forming a plurality of contacts, including a first plurality of contacts respectively extending through the insulation structure and the protection layer to directly contact one of the contact regions and one of the first gate structures in the cell area, and a second plurality of contacts respectively extending through the insulation structure and the protection layer to directly contact either one of the other gate structures or a portion of the semiconductor substrate in the peripheral circuit area, wherein the plurality of contacts includes contacts having substantially different heights;
forming an anti-reflection layer on the planarized upper surface of the second insulating interlayer:
forming a photoresist layer on the anti-reflection layer; and
patterning the photoresist later and anti-reflection layer to form a photoresist pattern, wherein forming the plurality of contacts comprises;
forming a plurality of contact holes extending through the insulation structure to expose portions of the protection layer using the photoresist pattern;
etching the exposed portions of the protection layer to expose respectively, at least one of the first gate structures in the cell area, at least one of the contact regions, and at least one selected portion of the semiconductor substrate in the peripheral, area, and at least one of the other gate structures; and
filling the plurality of contact holes with a conductive material.

19. The method of claim 18, further comprising:
selectively forming a plurality of openings in upper portions of selected ones of the plurality of contact holes corresponding to a plurality of bit line contacts, such that upon filling the plurality of contact holes with the conductive material a plurality of bit lines is formed integrally and respectively connected to the plurality of bit line contacts.

20. The method of claim 19, further comprising:
forming a barrier layer on the insulation structure and upper portions of the plurality of contacts; and
forming a third insulating interlayer on the barrier layer.

21. The method of claim 20, further comprising:
forming a ferroelectric capacitor on the third insulting interlayer, such that the ferroelectric capacitor is electrically connected to one of the first plurality of contacts.

22. A method of manufacturing a semiconductor device, the method comprising:
forming a plurality of first gate structures in a cell area of a semiconductor substrate, and forming second and third gate structures in a peripheral circuit area of the semiconductor substrate;
forming a plurality of first source/drain regions in selected portions of the semiconductor substrate in the cell area;
forming a second source/drain region in a selected portion of the semiconductor substrate in the cell area;
forming a protection layer over the cell area and peripheral circuit area to directly contact the first gate structures, the second gate structure, the third gate structure, the plurality of first source/drain regions, and the second source/drain region;
forming an insulation structure on the protection layer;
forming a barrier layer on the insulation structure;
forming an insulating interlayer on the barrier layer; and,
forming a plurality of contacts including;
a bit line contact having a first height and extending through the insulation structure and the protection layer to directly contact the second source/drain region and sidewalls of the first gate structures adjacent to the second source/drain region, another contact having a second height and extending through the insulation structure and the protection layer to contact an upper portion of the third gate structure, and a capacitor contact having a third height and extending through insulating interlayer, the barrier layer, the insulation structure, and the protection layer to directly contact one of the plurality of first source/drain regions and sidewalls of the plurality of first gate structures adjacent to the first source/drain regions, wherein the first, second and third heights are different.

23. The method of claim 22, wherein the bit line contact and the another contact are simultaneously formed.

* * * * *